United States Patent
Yamanaka

(10) Patent No.: US 8,723,393 B2
(45) Date of Patent: May 13, 2014

(54) SURFACE ACOUSTIC WAVE DEVICE, ELECTRONIC APPARATUS, AND SENSOR APPARATUS

(75) Inventor: Kunihito Yamanaka, Kamiina (JP)

(73) Assignee: Seiko Epson Corporation (JP)

( * ) Notice: Subject to any disclaimer, the term of this patent is extended or adjusted under 35 U.S.C. 154(b) by 299 days.

(21) Appl. No.: 13/223,363

(22) Filed: Sep. 1, 2011

(65) Prior Publication Data

US 2012/0062329 A1   Mar. 15, 2012

(30) Foreign Application Priority Data

Sep. 9, 2010   (JP) .................................. 2010-201753

(51) Int. Cl.
| | |
|---|---|
| *H03H 9/145* | (2006.01) |
| *H03H 9/25* | (2006.01) |
| *H03H 9/19* | (2006.01) |
| *H03H 9/00* | (2006.01) |

(52) U.S. Cl.
USPC ............... 310/313 A; 310/313 B; 310/313 D; 310/360; 333/194; 333/195

(58) Field of Classification Search
USPC ....................... 310/313 R, 313 A–313 D, 360; 333/193–196
See application file for complete search history.

(56) References Cited

U.S. PATENT DOCUMENTS

| | | | |
|---|---|---|---|
| 4,387,355 A | 6/1983 | Uno et al. | |
| 5,757,250 A | 5/1998 | Ichikawa et al. | |
| 5,895,996 A | 4/1999 | Takagi et al. | |
| 6,329,888 B1 | 12/2001 | Hirota | |
| 6,674,215 B1 | 1/2004 | Yoshida et al. | |
| 7,027,921 B2 | 4/2006 | Kalantar-Zadeh et al. | |
| 7,352,104 B2 | 4/2008 | Yamazaki et al. | |
| 7,382,217 B2* | 6/2008 | Morita et al. | ................. 333/195 |
| 7,589,451 B2 | 9/2009 | Morita et al. | |

(Continued)

FOREIGN PATENT DOCUMENTS

| | | |
|---|---|---|
| CN | 1336036 A | 2/2002 |
| CN | 1434568 A | 8/2003 |

(Continued)

OTHER PUBLICATIONS

Takehiko Uno, Nobuhide Miyamoto and Hiroshi Abe (Electrical Communication Laboratories, NTT), "Fabrication of SAW Resonators with Groove Gratings and their Characteristics", (Oct. 18, 1982) (pp. 45-52) with English translation.

*Primary Examiner* — Thomas Dougherty
(74) *Attorney, Agent, or Firm* — Harness, Dickey & Pierce, P.L.C.

(57) ABSTRACT

A SAW device 11 has an IDT which is provided on the principal surface of a quartz crystal substrate 12 having Euler angles ($-1.5° \leq \phi \leq 1.5°$, $117° \leq \theta \leq 142°$, $42.79° \leq |\psi| \leq 49.57°$) and excites a SAW in a stopband upper end mode, and a pair of reflectors which are arranged on both sides of the IDT. Inter-electrode-finger grooves are recessed between the electrode fingers of the IDT, and inter-conductor-strip grooves are recessed between the conductor strips of the reflectors. The wavelength $\lambda$ of the SAW and the depth G of the inter-electrode-finger grooves satisfy $0.01\lambda \leq G$. An IDT line occupancy $\eta$ and the depth G of the inter-electrode-finger grooves satisfy a predetermined relational expression. The IDT line occupancy $\eta$ and a reflector line occupancy $\eta r$ satisfy the relationship $\eta < \eta r$. Therefore, an excellent frequency-temperature characteristic and a high Q value in an operation temperature range are realized simultaneously.

17 Claims, 11 Drawing Sheets

(56) References Cited

U.S. PATENT DOCUMENTS

| | | |
|---|---|---|
| 7,696,675 B2 | 4/2010 | Kanna |
| 8,063,534 B2 | 11/2011 | Iizawa |
| 8,084,918 B2 | 12/2011 | Iizawa |
| 8,237,326 B2 | 8/2012 | Iizawa |
| 8,305,162 B2 * | 11/2012 | Yamanaka .................. 333/193 |
| 2003/0052572 A1 | 3/2003 | Iizawa et al. |
| 2003/0168932 A1 | 9/2003 | Shibata et al. |
| 2004/0135469 A1 | 7/2004 | Kanna |
| 2005/0122179 A1 | 6/2005 | Ogiso |
| 2005/0168302 A1 | 8/2005 | Orito et al. |
| 2006/0108894 A1 | 5/2006 | Kanna |
| 2006/0145568 A1 | 7/2006 | Morita et al. |
| 2007/0182278 A1 | 8/2007 | Kanna |
| 2008/0084134 A1 | 4/2008 | Morita et al. |
| 2009/0021108 A1 | 1/2009 | Owaki et al. |
| 2009/0206955 A1 | 8/2009 | Iizawa |
| 2010/0219913 A1 | 9/2010 | Yamanaka |
| 2010/0244626 A1 | 9/2010 | Yamanaka |
| 2011/0309897 A1 | 12/2011 | Yamanaka |
| 2012/0049979 A1 | 3/2012 | Owaki et al. |
| 2012/0062069 A1 * | 3/2012 | Yamanaka ................ 310/313 A |
| 2012/0062329 A1 * | 3/2012 | Yamanaka .................... 331/158 |
| 2012/0068573 A1 | 3/2012 | Obata |
| 2012/0086308 A1 | 4/2012 | Obata et al. |
| 2012/0139652 A1 | 6/2012 | Yamanaka |
| 2012/0212301 A1 | 8/2012 | Yamanaka |
| 2012/0223411 A1 | 9/2012 | Cho et al. |
| 2013/0027147 A1 | 1/2013 | Yamanaka |

FOREIGN PATENT DOCUMENTS

| | | |
|---|---|---|
| CN | 1619956 A | 5/2005 |
| CN | 101820265 A | 9/2010 |
| JP | 57-005418 | 1/1982 |
| JP | 61/092011 | 5/1986 |
| JP | 63-088910 | 4/1988 |
| JP | 1-34411 | 7/1989 |
| JP | 01-231412 | 9/1989 |
| JP | 02-189011 | 7/1990 |
| JP | 05-090865 | 4/1993 |
| JP | 08-307190 | 11/1996 |
| JP | 10-270974 | 10/1998 |
| JP | 3216137 | 8/2001 |
| JP | 3216137 B2 | 10/2001 |
| JP | 3266846 | 1/2002 |
| JP | 2002-100959 | 4/2002 |
| JP | 2003-283282 | 10/2003 |
| JP | 2005-204275 | 7/2005 |
| JP | 2006-013576 | 1/2006 |
| JP | 2006-148622 | 6/2006 |
| JP | 2006-203408 | 8/2006 |
| JP | 3851336 | 11/2006 |
| JP | 2007-208871 | 8/2007 |
| JP | 2007-267033 | 10/2007 |
| JP | 2007-300287 | 11/2007 |
| JP | 2009-225420 | 10/2009 |
| WO | WO 2005/099089 | 10/2005 |
| WO | WO-2006-137464 A1 | 12/2006 |
| WO | WO-2010-098139 A1 | 9/2010 |

* cited by examiner $\eta = L/(L+S)$

SURFACE ACOUSTIC WAVE DEVICE, ELECTRONIC APPARATUS, AND SENSOR APPARATUS

TECHNICAL FIELD

The present invention relates to a surface acoustic wave device, such as a resonator or an oscillator using a surface acoustic wave (SAW), and an electronic apparatus and a sensor apparatus including the same.

RELATED ART

SAW devices are widely used in electronic apparatuses, such as a mobile phone, a hard disk, a personal computer, a receiver tuner of BS and CS broadcasts, an apparatus which processes a high-frequency signal or an optical signal propagating through a coaxial cable or an optical cable, a server network apparatus which requires a high-frequency and high-precision clock (low jitter and low phase noise) in a wide temperature range, and a wireless communication apparatus, or various sensor apparatuses, such as a pressure sensor, an acceleration sensor, and a rotational speed sensor. In these apparatuses and devices, in particular, with the realization of a high-frequency reference clock due to recent high-speed performance of information communication or the reduction in the size of the apparatus casing, there is an increasing influence of heat generation inside the apparatus. For this reason, with regard to an electronic device which is mounted in the apparatus, expansion or high-precision performance of an operation temperature range is required. A stable operation is required over a long period in an environment in which there is a severe change in the temperature from a low temperature to a high temperature, like a wireless base station outdoors.

In general, in a SAW device, such as a SAW resonator, a change in the frequency-temperature characteristic is significantly influenced by the SAW stopband, the cut angle of a quartz crystal substrate to be used, the form of an IDT (interdigital transducer) formed on the substrate, or the like. For example, a reflection inverting-type SAW converter is suggested in which an IDT having a unit segment repeatedly arranged on a piezoelectric substrate is provided, the unit segment having three electrode fingers per SAW wavelength, and the upper mode and lower mode of the SAW stopband are excited (for example, see Japanese Patent No. 3266846). If a SAW filter is constituted by the reflection inverting-type SAW converter, it is possible to realize a high attenuation amount in a blocked band on a high-frequency band side near a passband.

A reflection inverting-type SAW converter is known in which a so-called ST cut quartz crystal substrate having Euler angles $(\phi, \theta, \psi)=(0°, 123°, 0°)$ is used (for example, see JP-A-2002-100959). JP-A-2002-100959 describes that the resonance of the upper end mode of the stopband can be excited, and the frequency-temperature characteristic is improved compared to a case where the resonance of the lower end mode of the stopband is used. It is reported that the upper end of the SAW stopband has a satisfactory frequency-temperature characteristic compared to the lower end of the stopband (for example, see JP-A-2006-148622, JP-A-2007-208871, JP-A-2007-267033 and JP-A-2007-300287).

In particular, JP-A-2006-148622 and JP-A-2007-208871 describe a technique which adjusts the cut angle of the quartz crystal substrate and thickens the standardized thickness $(H/\lambda)$ of an IDT electrode to about 0.1 so as to obtain a satisfactory frequency-temperature characteristic in a SAW device using a Rayleigh wave. A SAW resonator described in JP-A-2006-148622 has a single-type IDT electrode in which a unit segment having two electrode fingers per SAW wavelength is repeatedly arranged on a quartz crystal substrate having Euler angles $(\phi, \theta, \psi)=(\phi=0°, 0°\leq\theta\leq180°, 0°<|\psi|<90°)$. Thus, the Rayleigh wave is excited in the stopband upper limit mode, thereby realizing high-frequency performance and a satisfactory frequency-temperature characteristic of a SAW resonator.

JP-A-2007-208871 describes a technique which, in a SAW device which has the single-type IDT electrode, sets a quartz crystal substrate at Euler angles $(\phi, \theta, \psi)=(\phi=0°, 110°\leq\theta\leq140°, 38°\leq|\psi|\leq44°)$, and sets the relationship between the standardized electrode thickness $(H/\lambda)$ and the standardized electrode width $\eta$ $(=d/P)$ defined by the thickness H of the IDT electrode, the width d of an electrode finger in the IDT electrode, the pitch P between electrode fingers in the IDT electrode, and the SAW wavelength $\lambda$ as follows.

$$H/\lambda \geq 0.1796\eta^3 - 0.4303\eta^2 + 0.2071\eta + 0.0682$$

Thus, it is possible to strongly excite the Rayleigh wave in the stopband upper limit mode.

JP-A-2007-267033 describes a SAW element in which a single-type IDT electrode is arranged on a quartz crystal substrate having Euler angles $(\phi, \theta, \psi)=(0°, \theta, 0°<|\psi|<46°)$, preferably, $(0°, 95°<\theta<155°, 33°<|\psi|<46°)$, and the standardized electrode thickness $(H/\lambda)$ is $0.045\leq H/\lambda\leq 0.085$. Thus, the Rayleigh wave is excited in the stopband upper limit mode, thereby realizing a satisfactory frequency-temperature characteristic.

JP-A-2007-300287 describes a SAW element in which the single-type IDT electrode is arranged on an in-plane rotation ST cut quartz crystal substrate having Euler angles $(\phi, \theta, \psi)=0°, 123°, 43.2°)$, and the standardized electrode thickness $(H/\lambda)$ is $H/\lambda=0.06$, so-called 6%$\lambda$, thereby exciting the Rayleigh wave in the stopband upper limit mode. The SAW element sets the standardized electrode width $\eta$ $(=Lt/Pt)$ defined by the electrode finger width Lt of the IDT electrode and the electrode finger pitch Pt to $0.5\leq\eta\leq 0.7$, thereby realizing a frequency deviation of maximum 830 ppm at normal temperature (25° C.).

A SAW resonator is also known in which grooves are formed in the surface of a quartz crystal substrate between electrode fingers constituting an IDT and between conductor strips constituting a reflector (for example, see JP-B-2-7207 (JP-A-57-5418) and Manufacturing Conditions and Characteristics of Groove-type SAW Resonator (IECE, Technical Research Report MW82-59 (1982))). JP-B-2-7207 (JP-A-57-5418) describes a SAW resonator in which an IDT and a reflector are formed of aluminum electrodes on an ST cut X-propagation quartz crystal substrate, and grooves are formed in the corresponding regions between electrode fingers constituting the IDT and between conductor strips constituting the reflector on the surface of the quartz crystal substrate, thereby realizing a high Q value, a low capacitance ratio, and low resonance resistance. JP-B-2-7207 (JP-A-57-5418) describes a structure in which the groove of the IDT and the groove of the reflector have the same depth and a structure in which the groove of the reflector is greater in depth than the groove of the IDT.

Manufacturing Conditions and Characteristics of Groove-type SAW Resonator (IECE, Technical Research Report MW82-59 (1982)) describes the characteristic of a groove-type SAW resonator using an ST cut quartz crystal substrate. It has been reported that the frequency-temperature characteristic changes depending on the depth of the grooves formed in a quartz crystal surface uncovered with the electrodes of the SAW propagation substrate, and as the depth of the grooves increases, the peak temperature Tp of an upward convex quadratic curve decreases.

A method which forms grooves in a piezoelectric substrate, such as quartz crystal, to adjust an effective thickness and to adjust a frequency is well known to those skilled in the art (for example, see JP-A-2-189011, JP-A-5-90865, JP-A-1-231412 and JP-A-61-92011). In a SAW device described in JP-A-2-189011, the surface of the piezoelectric substrate having an IDT formed thereon is etched under the condition that the etching rate of the piezoelectric substrate is greater than the etching rate of the IDT, and fine adjustment is performed to lower the frequency. In JP-A-5-90865, JP-A-1-231412 and JP-A-61-92011 similarly, the surface of a piezoelectric substrate is dry-etched with the IDT formed thereon as a mask, such that the frequency of the SAW device is shifted to a low-frequency band side.

In a transversal SAW filter, a technique is known in which the surface of a piezoelectric substrate between electrode fingers of an IDT electrode is etched to form grooves, thereby reducing an apparent propagation speed (for example, see JP-A-10-270974). Thus, it is possible to make the electrode finger pitch of the IDT electrode small without changing the preliminary design of the SAW filter, thereby realizing reduction in size of a chip.

In a SAW resonator which excites a shear wave called an SSBW (Surface Skimming Bulk Wave), it is known that an IDT electrode having a standardized electrode thickness $(H/\lambda)$ of $2.0 \leq H/\lambda \leq 4.0\%$ is formed of aluminum on a rotation Y cut quartz crystal substrate in which a cut angle is $-43°$ to $-52°$ and a shear wave propagation direction is a Z'-axis direction (Euler angles $(\phi, \theta, \psi)=(0°, 28 \leq \theta \leq 47, 90°)$), thereby realizing a frequency-temperature characteristic of a cubic curve (for example, see JP-B-1-34411). A shear wave (SH wave) propagates directly below the surface of the piezoelectric substrate in a state where vibration energy is confined directly below the electrode. Thus, the reflection efficiency of the SAW by the reflector is unsatisfactory compared to an ST cut quartz crystal SAW device in which a SAW propagates along the substrate surface, making it difficult to realize reduction in size and a high Q value.

In order to solve this problem, a SAW device is suggested in which an IDT and a grating reflector are formed in the surface of a rotation Y cut quartz crystal substrate having Euler angles $(\phi, \theta, \psi)=(0°, -64°<\theta<-49.3°, 85° \leq \psi \leq 95°)$ to excite an SH wave (for example, see International Publication No. WO2005/099089A1). The SAW device sets the electrode thickness $H/\lambda$ standardized with the SAW wavelength $\lambda$ to $0.04<H/\lambda<0.12$, thereby realizing reduction in size, a high Q value, and excellent frequency stability.

In such a SAW device, in order to solve a problem in that the Q value or frequency stability is deteriorated due to stress migration caused by a large electrode thickness, a technique is suggested in which grooves are formed in the quartz crystal substrate between the electrode fingers of the IDT (for example, see JP-A-2006-203408). When the depth of the grooves is Hp and the thickness of a metal film of the IDT is Hm, the electrode thickness $H/\lambda$ standardized with the SAW wavelength $\lambda$ is set to $0.04<H/\lambda<0.12$ (where $H=Hp+Hm$), such that the apparent thickness of the metal film can be made small. Thus, it is possible to suppress a frequency fluctuation due to stress migration at the time of electrical conduction, thereby realizing a SAW device having a high Q value and excellent frequency stability.

During the mass production of SAW devices, when electrode fingers of an IDT are formed in the surface of a quartz crystal substrate by etching, if the thickness of the electrode fingers is large, a variation is likely to occur in the line occupancy (line space ratio) $\eta$ of the IDT due to side etching. As a result, if a variation occurs in the frequency fluctuation with a change in the temperature of the SAW device, product reliability and quality are damaged. In order to solve this problem, a SAW device is known in which an in-plane rotation ST cut quartz crystal substrate having Euler angles $(\phi, \theta, \psi)=(0°, 95° \leq \theta \leq 155°, 33° \leq |\psi| \leq 46°)$ is used, a SAW stopband upper limit mode is excited, and inter-electrode-finger grooves are formed in the surface of the quartz crystal substrate between electrode fingers of an IDT (for example, see JP-A-2009-225420).

When the frequency-temperature characteristic of the SAW device is a quadratic curve in the operation temperature range, it is difficult to realize minimization of a frequency fluctuation range or an inflection point. Accordingly, a SAW device is suggested in which, in order to obtain a frequency-temperature characteristic of a cubic curve, an IDT electrode is formed on an LST cut quartz crystal substrate through a void layer and a dielectric film to excite a leaky SAW (for example, see Japanese Patent No. 3851336). Japanese Patent No. 3851336 describes that, in a SAW device using a Rayleigh wave, a quartz crystal substrate having a cut angle such that a frequency-temperature characteristic expressed by a cubic curve is realized could not be found.

In an ST cut quartz crystal SAW resonator or the like, in order to increase the Q value without deteriorating an excellent frequency-temperature characteristic, an inclined IDT is known in which an IDT and a reflector are arranged on the surface of a quartz crystal substrate to be inclined at a power flow angle PFA±3° with respect to a SAW phase velocity direction (for example, see Japanese Patent No. 3216137 and JP-A-2005-204275). In the SAW device having the inclined IDT, the IDT and the reflector are arranged so as to cover a SAW phase traveling direction and a vibration energy traveling direction, such that the SAW can be efficiently reflected by the reflector. Thus, it is possible to efficiently perform energy confinement and to further increase the Q value.

As described above, many elements are related to the frequency-temperature characteristic of the SAW device, and various studies are conducted for improvement. In particular, in a SAW device using a Rayleigh wave, it is considered that an increase in the thickness of the electrode fingers constituting the IDT contributes to the improvement of the frequency-temperature characteristic. If the electrode thickness of the IDT simply increases, there is a problem in that deterioration in frequency stability (depending on a change in the line occupancy) or the like occurs due to stress migration at the time of electrical conduction or side etching at the time of IDT formation. As a countermeasure, grooves are formed between the electrode fingers of the IDT in the surface of the quartz crystal substrate, and it is effective to suppress a frequency fluctuation by increasing the effective thickness while making the electrode thickness small.

However, in all the SAW devices, excluding the SAW device described in JP-B-1-34411 which excites a leaky SAW, since the frequency-temperature characteristic in the operation temperature range is expressed by a quadratic curve, it is difficult to sufficiently reduce a frequency fluctuation range or to realize an inflection point. For this reason, it may be impossible to sufficiently cope with recent requirements for a SAW device, such as expansion or high-precision performance of an operation temperature range, long-term operation stability in an environment in which temperature undergoes severe changes, and the like.

An advantage of some aspects of the invention is that it provides a SAW device, such as a resonator or an oscillator, capable of exhibiting an excellent frequency-temperature characteristic with a very small frequency fluctuation in an operation temperature range, having an excellent environment-resistant characteristic ensuring a stable operation even in an environment in which temperature varies extremely, and realizing a high Q value.

SUMMARY

With regard to a SAW resonator in which an in-plane rotation ST cut quartz crystal substrate is used, an IDT which excites a SAW in a stopband upper end mode is formed on the surface of the quartz crystal substrate, and the surface of the quartz crystal substrate between electrode fingers constituting the IDT is recessed to form grooves, the inventors have verified the relationship between parameters, such as the wavelength $\lambda$ of the SAW, the depth G of the grooves, the electrode thickness H of the IDT, and the line occupancy $\eta$ of the electrode fingers, and the frequency-temperature characteristic. As a result, the inventors have devised a novel SAW resonator which can realize minimization of a frequency fluctuation range and an inflection point in the operation temperature range.

A SAW resonator according to a new embodiment (hereinafter, referred to as a SAW resonator of this embodiment) includes an IDT which is provided on a quartz crystal substrate having Euler angles ($-1.5° \leq \phi \leq 1.5°$, $117° \leq \theta \leq 142°$, $42.79° \leq |\psi| \leq 49.57°$), and excites a SAW in a stopband upper end mode. The quartz crystal substrate between electrode fingers constituting the IDT is depressed to form inter-electrode-finger grooves. When the wavelength of the SAW is $\lambda$, and the depth of the inter-electrode-finger groove is G, the relationship $0.01\lambda \leq G$ is satisfied. When the line occupancy of the IDT is $\eta$, the depth G of the inter-electrode-finger grooves and the line occupancy $\eta$ satisfy the following relationships.

[Equation 1]

$$-2.0000 \times G/\lambda + 0.7200 \leq \eta \leq -2.5000 \times G/\lambda + 0.7775 \text{ where } 0.0100\lambda \leq G \leq 0.0500\lambda \quad (1)$$

[Equation 2]

$$-3.5898 \times G/\lambda + 0.7995 \leq \eta \leq -2.5000 \times G/\lambda + 0.7775 \text{ where } 0.0500\lambda \leq G \leq 0.0695\lambda \quad (2)$$

In the SAW resonator of this embodiment, the depth G of the inter-electrode-finger grooves may satisfy the relationship $0.01\lambda \leq G \leq 0.0695\lambda$. If the depth G of the inter-electrode-finger grooves is set within this range, it is possible to suppress a frequency fluctuation in an operation temperature range (for example, $-40°$ C. to $+85°$ C.) to be small, and even when a manufacturing variation occurs in the depth of the inter-electrode-finger grooves, it is possible to suppress the shift amount of a resonance frequency between individual SAW resonators within a correctable range.

In the SAW resonator of this embodiment, when the electrode thickness of the IDT is H, the relationship $0 < H \leq 0.035\lambda$ may be satisfied. Therefore, a satisfactory frequency-temperature characteristic in an operation temperature range is realized, and deterioration in an environment-resistant characteristic which may occur when the electrode thickness is large is prevented.

In the SAW resonator of this embodiment, the line occupancy $\eta$ may satisfy the following relationship.

[Equation 3]

$$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) \quad (3)$$

Therefore, it is possible to suppress a secondary temperature coefficient of the frequency-temperature characteristic to be small.

In the SAW resonator of this embodiment, the sum of the depth G of the inter-electrode-finger grooves and the electrode thickness H may satisfy the relationship $0.0407\lambda \leq G+H$. Therefore, a high Q value is obtained compared to the related art which uses resonance in a stopband lower end mode with no grooves between electrode fingers.

FIG. 1 shows an example of a SAW resonator of this embodiment. As shown in FIG. 1(A), a SAW resonator 1 of this embodiment has a rectangular quartz crystal substrate 2, and an IDT 3 and a pair of reflectors 4 and 4 which are formed on the principal surface of the quartz crystal substrate.

For the quartz crystal substrate 2, an in-plane rotation ST cut quartz crystal substrate which is expressed by Euler angles ($-1.5° \leq \phi \leq 1.5°$, $117° \leq \theta \leq 142°$, $42.79° \leq |\psi| \leq 49.57°$) is used. Here, the Euler angles will be described. A substrate which is expressed by Euler angles ($0°$, $0°$, $0°$) becomes a Z cut substrate which has a principal surface perpendicular to the Z axis. Of the Euler angles ($\phi$, $\theta$, $\psi$), $\phi$ relates to the first rotation of the Z cut substrate, and is a first rotation angle with the Z axis as a rotation axis. The rotation direction from the +X axis to the +Y axis is defined as a positive rotation angle. Of the Euler angles, $\theta$ relates to the second rotation after the first rotation of the Z cut substrate, and is a second rotation angle with the X axis after the first rotation as a rotation axis. The rotation direction from the +Y axis after the first rotation to the +Z axis is defined as a positive rotation angle. The cut plane of the piezoelectric substrate is determined by the first rotation angle $\phi$ and the second rotation angle $\theta$. Of the Euler angles, $\psi$ relates to the third rotation after the second rotation of the Z cut substrate, and is a third rotation angle with the Z axis after the second rotation as a rotation axis. The rotation direction from the +X axis after the second rotation to the +Y axis after the second rotation is defined as a positive rotation angle. The SAW propagation direction is expressed by the third rotation angle $\psi$ with respect to the X axis after the second rotation.

As shown in FIG. 2, when three crystal axes perpendicular to quartz crystal, that is, an electrical axis, a mechanical axis, and an optical axis are respectively expressed by the X axis, the Y axis, and the Z axis, the in-plane rotation ST cut quartz crystal substrate is cut from a wafer 5 which has an XZ' plane perpendicular to the Y' axis of the coordinate axes (X, Y', Z') obtained by rotating an XZ plane 5a perpendicular to the Y axis at an angle $\theta'$ ($°$) from the +Z axis to the $-Y$ axis with the X axis as a rotation axis. The quartz crystal substrate 2 is cut and individualized from the wafer 5 along new coordinate axes (X', Y', Z") at an angle $+\psi$ (or $-\psi$) ($°$) from the +X axis to the +Z' axis with the Y' axis as a rotation axis. The direction from the +X axis to the +Z' axis is defined as positive. At this time, the long side (or short side) of the quartz crystal substrate 2 may be arranged along either the X'-axis direction or the Z"-axis direction. The angle $\theta'$ and $\theta$ of the Euler angles satisfy the relationship $\theta' = \theta - 90°$.

An IDT 3 has a pair of interdigital transducers 3a and 3b which respectively have a plurality of electrode fingers 6a and 6b, and bus bars 7a and 7b connecting the base portions of the electrode fingers together. The electrode fingers 6a and 6b are arranged such that the extension direction thereof is perpendicular to the propagation direction X' of the SAW which is excited by the IDT. The electrode fingers 6a of the interdigital transducer 3a and the electrode fingers 6b of the interdigital transducer 3b are arranged with a given pitch alternately and at a predetermined interval. As shown in FIG. 1(B), inter-electrode-finger grooves 8 having a given depth are recessed in the surface of the quartz crystal substrate 2 which is exposed between the electrode fingers 6a and 6b by removing the surface through etching or the like.

A pair of reflectors 4 and 4 are arranged outside the IDT 3 with the IDT sandwiched therebetween along the SAW propagation direction X'. The reflectors 4 respectively have a plurality of conductor strips 4a and 4a arranged with a given pitch in the SAW propagation direction X'. Similarly to the electrode fingers of the IDT 3, the conductor strips are arranged such that the extension direction thereof is perpendicular to the SAW propagation direction X'. As shown in FIG. 1(B), inter-conductor-strip grooves 9 having a given depth are recessed in the surface of the quartz crystal substrate 2 which is exposed between the conductor strips 4a and 4a by removing the surface through etching or the like.

In this embodiment, the electrode fingers 6a and 6b and the conductor strips 4a and 4a are formed of a metal film using, for example, Al or an alloy mainly containing Al to have the same thickness H, and can be collectively referred to as electrode fingers. The inter-electrode-finger grooves 8 and the inter-conductor-strip grooves 9 are formed to have the same depth G. Grooves are recessed between the outermost electrode fingers 6a (or 6b) of the IDT 3 and the conductor strips of the reflectors 4 and 4 adjacent to the electrode fingers by removing the surface of the quartz crystal substrate to have the same depth as the inter-conductor-strip grooves.

The SAW resonator 1 configured as above excites a Rayleigh-type SAW which has vibration displacement components in both the X'-axis direction and the Y'-axis direction of the quartz crystal substrate 2. In the quartz crystal substrate 2 having the above-described Euler angles, the SAW propagation direction is shifted from the X axis serving as the crystal axis of quartz crystal, making it possible to excite the SAW in the stopband upper end mode.

The Euler angles ($\phi$, $v$, $\psi$) of the quartz crystal substrate 2 were selected as follow. In general, the frequency-temperature characteristic of the SAW resonator is expressed by the following expression.

$$\Delta f = \alpha \times (T-T0) + \beta \times (T-T0)^2$$

Here, $\Delta f$ is a frequency change amount (ppm) between a temperature T and a peak temperature T0, $\alpha$ is a primary temperature coefficient (ppm/° C.), $\beta$ is a secondary temperature coefficient (ppm/° C.$^2$), T is a temperature, and T0 is a temperature (peak temperature) at which a frequency is maximum. The absolute value of the secondary temperature coefficient $\beta$ is set to be minimum, preferably, equal to or smaller than 0.01 (ppm/° C.$^2$), and more preferably, substantially zero, such that a frequency-temperature characteristic shows a cubic curve, a frequency fluctuation becomes small even in a wide operation temperature range, thereby obtaining high frequency stability.

First, the Euler angles of the quartz crystal substrate 2 were set to (0°, 123°, $\psi$), and the relationship between the Euler angle $\psi$ and the depth G of the inter-electrode-finger grooves when the line occupancy $\eta$ resulting in $\beta=\pm 0.01$ (ppm/° C.$^2$) has been obtained was simulated. The Euler angle $\psi$ was appropriately selected such that the absolute value of the secondary temperature coefficient $\beta$ became 0.01 (ppm/° C.$^2$). As a result, the range of the Euler angle $\psi$ for obtaining the secondary temperature coefficient $\beta$ of $-0.01 \le \beta \le +0.01$ under the above-described condition could be determined to 43°<$\psi$<45°.

Next, when the cut angle of the quartz crystal substrate 2 and the SAW propagation direction were (0, $\theta$, $\psi$) in the Euler angle expression, the depth G of the inter-electrode-finger grooves was 0.04$\lambda$, the thickness H of the electrode fingers was 0.02$\lambda$, and the line occupancy $\eta$ was 0.6383 by Expression (3), changes in the secondary temperature coefficient $\beta$ depending on the Euler angle $\theta$ were simulated. The Euler angle $\psi$ was appropriately selected in the above-described range 43°<$\psi$<45° such that the absolute value of the secondary temperature coefficient $\beta$ was minimum on the basis of the set angle of the angle $\theta$. As a result, if the Euler angle $\theta$ was within the range of 117°$\le\theta\le$142°, it was confirmed that, even when the thickness H of the electrode fingers, the depth G of the inter-electrode-finger grooves, and the line occupancy $\eta$ were changed, the absolute value of the secondary temperature coefficient $\beta$ was within the range of 0.01 (ppm/° C.$^2$).

Next, the quartz crystal substrate 2 was) ($\phi$, 123°, 43.77°) in the Euler angle expression, the depth G of the inter-electrode-finger grooves was 0.04$\lambda$, the thickness H of the electrode fingers was 0.02$\lambda$, and the line occupancy $\eta$ was 0.65, changes of the secondary temperature coefficient $\beta$ depending on the Euler angle $\phi$ were simulated. As a result, if the Euler angle $\phi$ was within the range of $-1.5°\le\phi\le+1.5°$, it was confirmed that the absolute value of the secondary temperature coefficient $\beta$ was within the range of 0.01 (ppm/° C.$^2$).

A highly desirable relationship between the Euler angles $\theta$ and $\psi$ such that a frequency fluctuation was minimum in an operation temperature range ($-40°$ C. to $+85°$ C.) was obtained by a simulation. In this case, the depth G of the inter-electrode-finger grooves and the thickness H of the electrode fingers were respectively G=0.04$\lambda$ and H=0.02$\lambda$. As a result, the Euler angle $\psi$ increased within the above-described range of the Euler angle $\theta$ such that a cubic curve was drawn with an increase in the Euler angle $\psi$. This relationship can be approximated by the following expression.

$$\psi = 1.19024 \times 10^{-3} \times \theta^3 - 4.48775 \times 10^{-1} \times \theta^2 + 5.64362 \times 10^1 \times \theta - 2.32327 \times 10^3 \pm 1.0 \quad \text{[Equation 4]}$$

Thus, the Euler angle $\psi$ becomes $\psi=42.79°$ with respect to the lower limit value $\theta=117°$ of the Euler angle $\theta$, and $\psi=49.57°$ with respect to the upper limit value $\theta=142°$ of the Euler angle $\theta$. Therefore, the Euler angle $\psi$ can be set to 42.79°$\le\psi\le$49.57° within the range of 117°$\le\theta\le$142°.

If the Euler angles of the quartz crystal substrate 2 are set in the above-described manner, the SAW resonator 1 of this embodiment can realize an excellent frequency-temperature characteristic in which the absolute value of the secondary temperature coefficient $\beta$ is equal to or smaller than 0.01 (ppm/° C.$^2$).

With regard to the SAW resonator 1 of this embodiment, a frequency-temperature characteristic was simulated under the following conditions.
Basic data of SAW resonator 1 of this embodiment
H: 0.02$\lambda$
G: change
IDT line occupancy $\eta$: 0.6
Reflector line occupancy $\eta$r: 0.8
Euler angles: (0°, 123°, 43.5°)
Number of pairs of IDT: 120
Electrode finger cross width: 40$\lambda$ ($\lambda$=10 μm)
Number of reflectors (per side): 60
Inclination angle of electrode fingers: none The simulation result is shown in FIG. 3. As will be understood from FIG. 3, the frequency-temperature characteristic substantially shows a cubic curve in the operation temperature range (−40 to +85° C.), and the frequency fluctuation range can be suppressed with a very small fluctuation within 20 ppm.

With regard to the SAW resonator 1 showing the frequency-temperature characteristic of FIG. 3, if the frequency, the equivalent circuit constant, and the static characteristic are put together, Table 1 is obtained.

TABLE 1

|  | F (MHz) | Q | γ | CI (Ω) | M |
| --- | --- | --- | --- | --- | --- |
| AVG | 318.25 | 13285 | 2476 | 21.8 | 5.4 |

Here, F is a frequency, Q is a Q value, γ is a capacitance ratio, CI is a CI (Crystal Impedance) value, and M is a figure of merit.

The SAW resonator 1 is preferably set such that the frequency ft2 of the stopband upper end of the IDT 3, the frequency fr1 of the stopband lower end of the reflector 4, and the frequency fr2 of the stopband upper end of the reflector 4 satisfy the relationship fr1<ft2<fr2. FIG. 4 shows the SAW reflection characteristics of the IDT 3 and the reflector 4 depending on the frequency. As shown in FIG. 4, if the frequency ft2 is set between the frequency fr1 and the frequency fr2, the reflection coefficient of the reflector 4 becomes larger than the reflection coefficient of the IDT 3 at the frequency ft2. As a result, the SAW in the stopband upper end mode excited from the IDT 3 is reflected from the reflector 4 to the IDT 3 with a higher reflection coefficient. Therefore, the vibration energy of the SAW can be efficiently confined, thereby realizing a low-loss SAW resonator 1.

The relationship between the Q value of the SAW resonator 1 and the magnitude (G+H) of a step formed by the height, that is, thickness H of the electrode fingers 6a and 6b and the depth G of the inter-electrode-finger grooves 8 was verified by a simulation. For comparison, with regard to a SAW resonator of the related art in which no grooves are formed between the electrode fingers and resonance in the stopband upper end mode is used, the relationship between the Q value and the height, that is, thickness of the electrode fingers was simulated under the following conditions.

Basic data of SAW resonator of the related art
H: change
G: zero (none)
IDT line occupancy η: 0.4
Reflector line occupancy ηr: 0.3
Euler angles (0°, 123°, 43.5°)
Number of pairs of IDT: 120
Electrode finger cross width: 40λ (λ=10 μm)
Number of reflectors (per side): 60
Inclination angle of electrode fingers: none The simulation result is shown in FIG. 5. In FIG. 5, a bold line indicates the SAW resonator 1 of this embodiment, and a thin line indicates the SAW resonator of the related art. As will be understood from FIG. 5, in the SAW resonator 1 of this embodiment, a high Q value can be obtained in a region where the step (G+H) is equal to or greater than 0.0407λ, (4.07%λ), compared to the SAW resonator of the related art.

With regard to the SAW resonator 1 of this embodiment, the inventors have verified the relationship between the Q value and the IDT and reflector line occupancies η and ηr by a simulation. As shown in FIGS. 1(C) and 1(D), the line occupancy η of the IDT 3 is a value obtained by dividing the electrode finger width L by the electrode finger pitch λ/2 (=L+S). The line occupancy ηr of the reflectors 4 has the same value as the line occupancy η of the IDT 3.

FIG. 1(D) illustrates a method of specifying the line occupancy η of the IDT 3 in a trapezoidal cross-section which will be formed when the electrode fingers 6a and 6b of the IDT 3 and the inter-electrode-finger grooves 8 are manufactured by a photolithography technique and an etching technique. In this case, the line occupancy η is calculated on the basis of the electrode finger width L and an inter-electrode-finger groove width S measured at a height half the sum (G+H) of the depth G of the inter-electrode-finger grooves from the bottom of the inter-electrode-finger grooves 8 and the electrode thickness H.

In this simulation, the Euler angles of the quartz crystal substrate 2 were set to (0°, 123°, ψ). The electrode fingers 6a and 6b of the IDT 3 and the conductor strips 4a and 4a of the reflectors 4 were formed of aluminum, and the thickness H thereof was 2% of the SAW wavelength λ, that is, H=0.02λ (2%λ). The depth G of the inter-electrode-finger grooves 8 and the inter-conductor-strip grooves 9 was 4.5% of the SAW wavelength λ, that is, G=0.045λ (4.5%λ). Thus, a step between adjacent electrode fingers 6a and 6b and conductor strips 4a and 4a, that is, 6.5% (G+H=0.065λ (6.5%λ)) of the SAW wavelength λ becomes the effective thickness of the electrode fingers and the conductor strips.

The line occupancy η of the IDT 3 was set to 0.625, 0.80, and 0.725, and the frequency-temperature characteristics were computed. FIG. 6(A) shows a frequency-temperature characteristic when η=0.625. In this case, a superior frequency-temperature characteristic of a cubic curve is obtained in the operation temperature range (−40° C. to +85° C.), and a frequency fluctuation is suppressed to be very small, about ±8 ppm.

FIG. 6(B) shows a frequency-temperature characteristic when η=0.80. FIG. 6(C) shows a frequency-temperature characteristic when η=0.725. In all cases, it is understood that a frequency-temperature characteristic shows a quadratic curve in the operation temperature range (−40° C. to +85° C.), and a frequency fluctuation is very large, about 40 ppm or about 35 ppm, and is deteriorated compared to FIG. 6(A). This is considered to be because the line occupancies η=0.80 and 0.725 of FIGS. 6(B) and (C) do not satisfy Expressions (1) and (2) in the relationship between the depth G of the inter-electrode-finger grooves and the SAW wavelength λ.

Accordingly, the inventors have simulated a change in the Q value with respect to the line occupancy η (ηr) of the IDT (and the reflectors). The simulation result is shown in FIG. 7. As will be understood from FIG. 7, as the line occupancy η increases, the Q value increases. However, when η=0.625 with an excellent frequency-temperature characteristic, it cannot be anticipated that the Q value is very small, 2000, and a stable oscillation operation is performed as an oscillator. Meanwhile, when η=0.725, the Q value becomes a maximum value 13500, and a stable oscillation operation can be performed as an oscillator, but a satisfactory frequency-temperature characteristic described above is not obtained.

In the SAW resonator of this embodiment, it is not possible to realize an excellent frequency-temperature characteristic and a high Q value simultaneously, and it is difficult to use the SAW resonator as an oscillator. In order to resolve this new problem, the inventors have studied the relationship between the line occupancies of the IDT and the reflectors, the frequency-temperature characteristic, and the Q value, have found that an excellent frequency-temperature characteristic and a high Q value could be realized simultaneously, and have devised the invention.

A SAW device according to an aspect of the invention includes a quartz crystal substrate having Euler angles (−1.5°≤φ≤1.5°, 117°≤θ≤142°, 42.79°≤|ψ|≤49.57°), an IDT which has a plurality of electrode fingers on the principal surface of the quartz crystal substrate and excites a surface acoustic wave in a stopband upper end mode, and a pair of reflectors which respectively have a plurality of conductor strips and are arranged on both sides of the IDT with the IDT sandwiched therebetween along the propagation direction of the surface acoustic wave. Inter-electrode-finger grooves are recessed in the surface of the quartz crystal substrate between adjacent electrode fingers of the IDT, and inter-conductor-strip grooves are recessed in the surface of the quartz crystal substrate between adjacent conductor strips of the reflectors. The wavelength λ of the surface acoustic wave and the depth G of the inter-electrode-finger grooves satisfy the relationship 0.01λ≤G. The line occupancy η of the IDT and the depth G of the inter-electrode-finger grooves satisfy the following relationships.

$$-2.0000 \times G/\lambda + 0.7200 \leq \eta \leq -2.5000 \times G/\lambda + 0.7775 \text{ where } 0.0100\lambda \leq G \leq 0.0500\lambda \quad \text{[Equation 5]}$$

$$-3.5898 \times G/\lambda + 0.7995 \leq \eta \leq -2.5000 \times G/\lambda + 0.7775 \text{ where } 0.0500\lambda \leq G \leq 0.0695\lambda \quad \text{[Equation 6]}$$

An IDT line occupancy η and a reflector line occupancy ηr satisfy the relationship η<ηr If the line occupancies of the IDT and the reflectors are set in the above-described manner, conductor strips having high reflection efficiency are arranged in the reflectors, such that the SAW vibration energy can be efficiently confined to the IDT sandwiched between the reflectors. As a result, it is possible to realize a SAW device which has excellent oscillation stability with a high Q value while securing and maintaining an excellent frequency-temperature characteristic with a very small frequency fluctuation and low impedance in a wide operation temperature range.

The reflector line occupancy ηr may satisfy 0.70≤ηr≤0.95. Therefore, as described below, it is possible to obtain a SAW device having a satisfactory Q value equal to or greater than 10000.

The pitch Pt of the electrode fingers of the IDT and the pitch Pr of the conductor strips of the reflectors may satisfy the relationship 0.995≤Pt/Pr≤1.010. Therefore, it is possible to minimize bulk radiation due to a difference between both pitches, and to obtain a high Q value.

In this case, the pitch Pt of the electrode fingers of the IDT and the pitch Pr of the conductor strips of the reflectors may satisfy the relationship 0.997≤Pt/Pr≤1.0075. Therefore, it is possible to further reduce the difference between both pitches, thereby obtaining a higher Q value.

The IDT line occupancy η may satisfy the following relationship.

$$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) \quad \text{[Equation 7]}$$

Therefore, it is possible to suppress the secondary temperature coefficient of the frequency-temperature characteristic smaller, thereby obtaining an excellent frequency-temperature characteristic of a cubic curve having a smaller frequency fluctuation.

The sum of the depth G of the inter-electrode-finger grooves and the thickness H of the electrode fingers may satisfy 0.0407λ≤G+H. Therefore, when resonance in a stopband upper end mode is used, a high Q value is obtained compared to a SAW resonator of the related art in which resonance in a stopband lower end mode is used with no grooves between the electrode fingers of the IDT.

An angle between a first direction perpendicular to the electrode fingers and the conductor strips and the electrical axis of the quartz crystal substrate may be the Euler angle ψ of the quartz crystal substrate, at least a part of the IDT and the reflectors may be arranged in a second direction intersecting the first direction at an angle δ, and the angle δ may be within a range of a power flow angle±1° of the quartz crystal substrate. Therefore, it is possible to further improve the Q value.

The SAW device may further include an oscillation circuit which drives the IDT. Therefore, it is possible to obtain a SAW oscillator having a very small frequency fluctuation in a wide operation temperature range, a low CI value, and excellent oscillation stability.

According to another aspect of the invention, an electronic apparatus and a sensor apparatus including the above-described SAW device are provided.

DETAILED DESCRIPTION

Figure 1A:
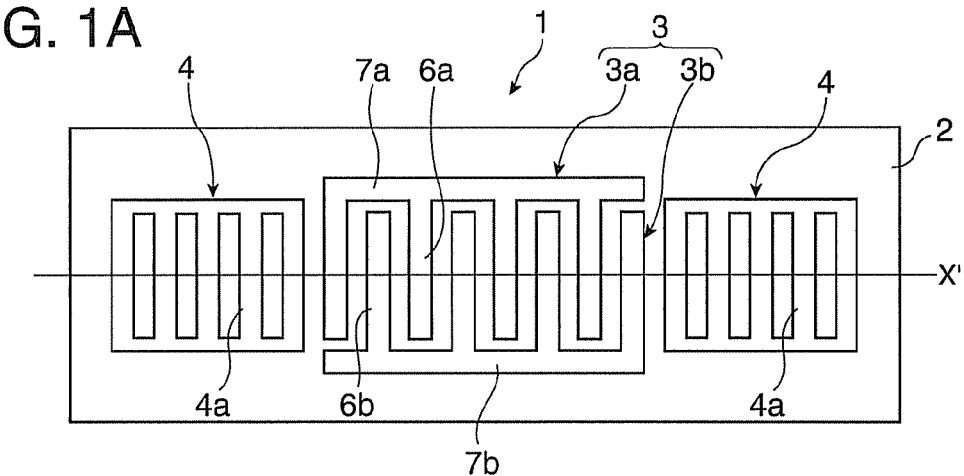
FIG. 1(A) is a plan view showing the configuration of a SAW resonator of this embodiment.
Figure 1B:
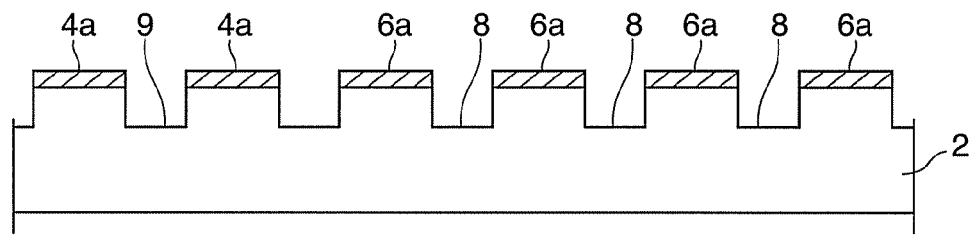
FIG. 1(B) is a partial enlarged longitudinal sectional view.
Figure 1C:
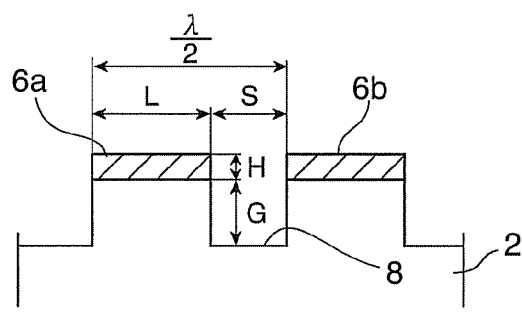
FIG. 1(C) is a partial enlarged view of FIG. 1(B)
Figure 1D:
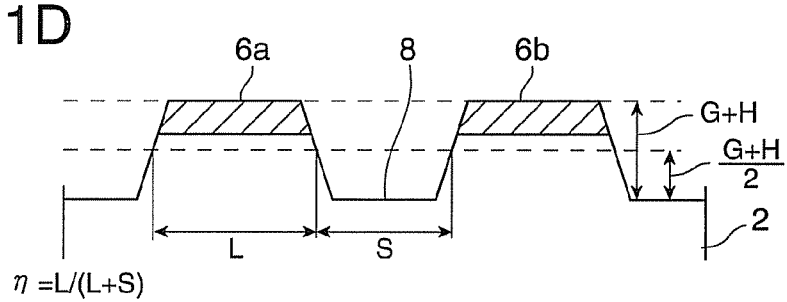
FIG. 1(D) is a diagram showing the sectional shape of a groove portion of FIG. 1(C) which is formed by photolithography and etching techniques.
Figure 2:
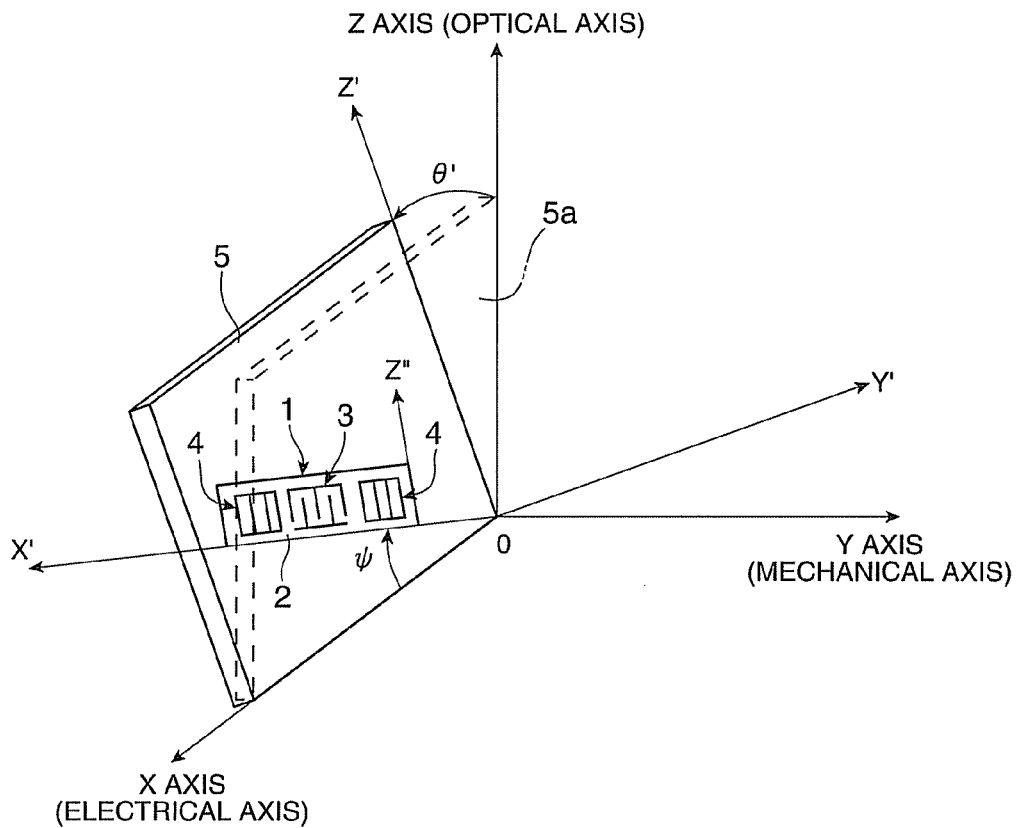
FIG. 2 is an explanatory view schematically showing a quartz crystal substrate of the SAW resonator of FIG. 1.
Figure 3:
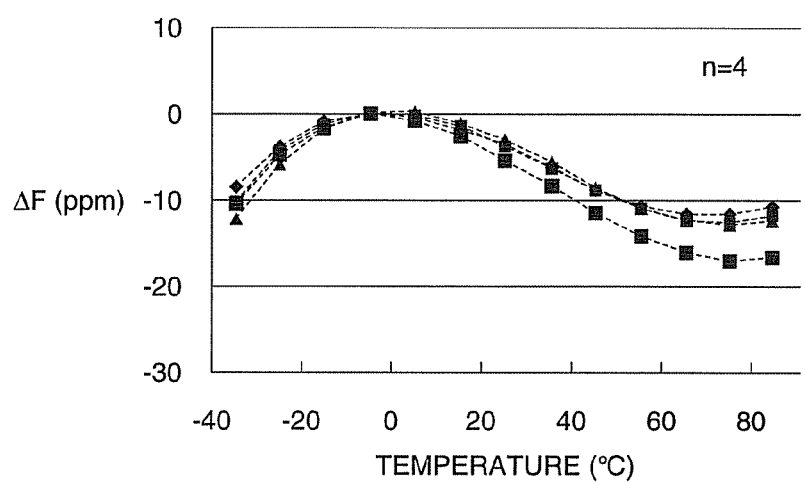
FIG. 3 is a diagram showing the frequency-temperature characteristic of the SAW resonator of FIG. 1.
Figure 4:
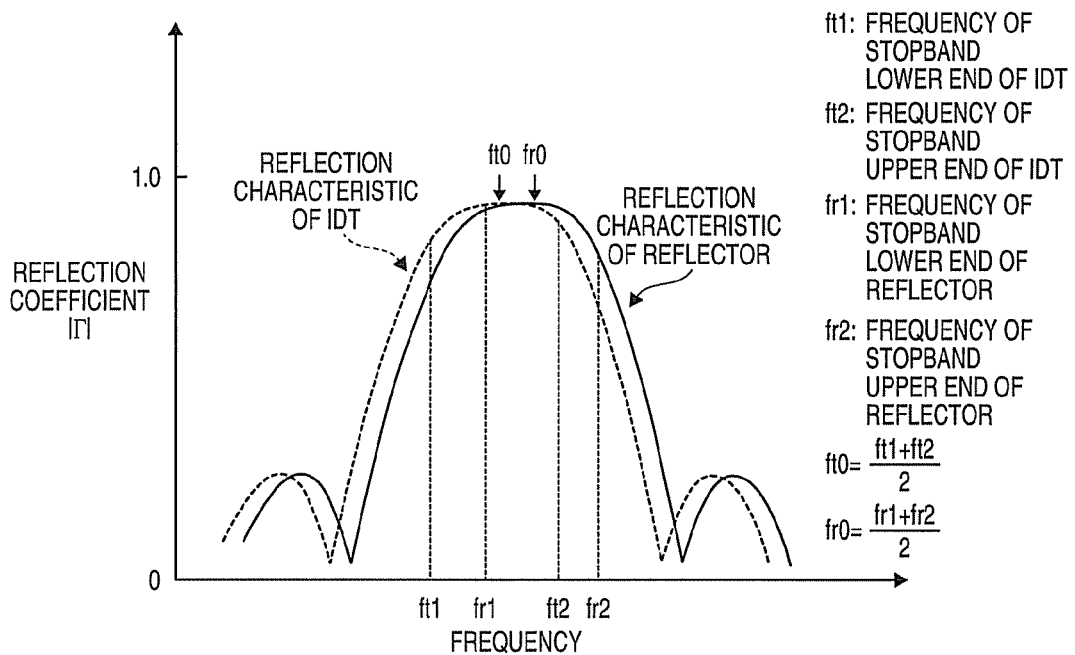
FIG. 4 is a diagram showing the SAW reflection characteristics of an IDT and a reflector in the SAW resonator of FIG. 1.
Figure 5:
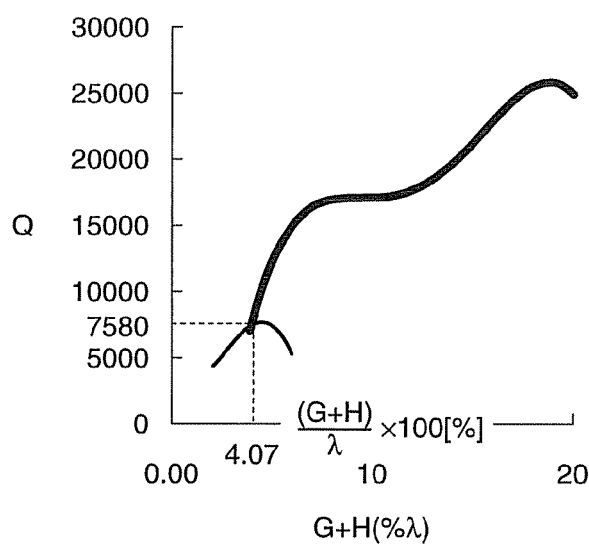
FIG. 5 is a diagram showing the relationship between an inter-electrode-finger step and a Q value in the SAW resonator of FIG. 1.
Figure 6A:
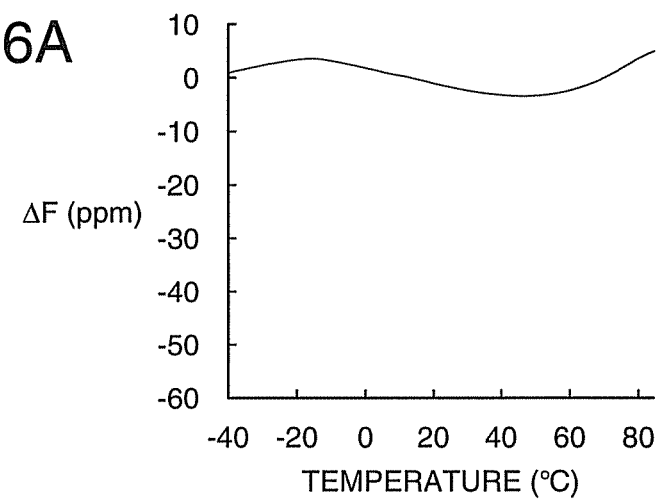
FIGS. 6(A) to 6(C) are diagrams showing frequency-temperature characteristics when the IDT line occupancy is η=0.625, 0.80, 0.725 in the SAW resonator of FIG. 1.
Figure 6B:
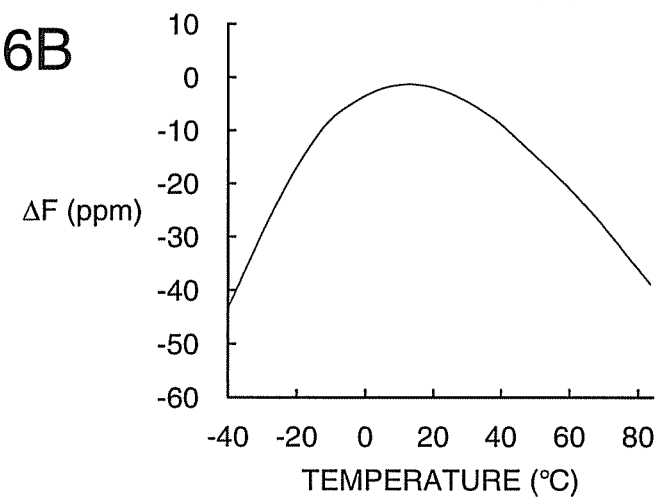
Figure 6C:
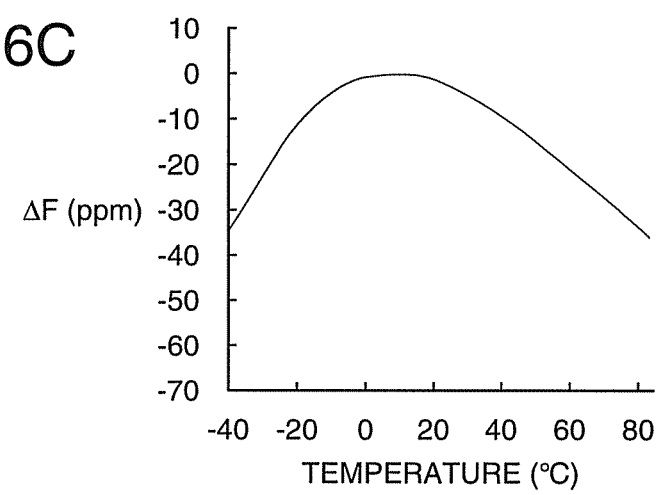
Figure 7:
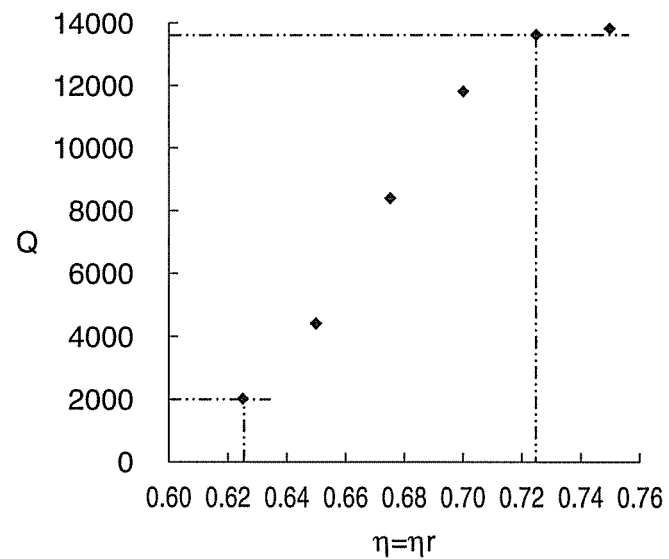
FIG. 7 is a diagram showing the relationship between the IDT line occupancy η and the Q value in the SAW resonator of FIG. 1.

Hereinafter, preferred examples of the invention will be described in detail with reference to the accompanying drawings. In the accompanying drawings, the same or similar constituent elements are represented by the same or similar reference numerals.

Figure 8A:
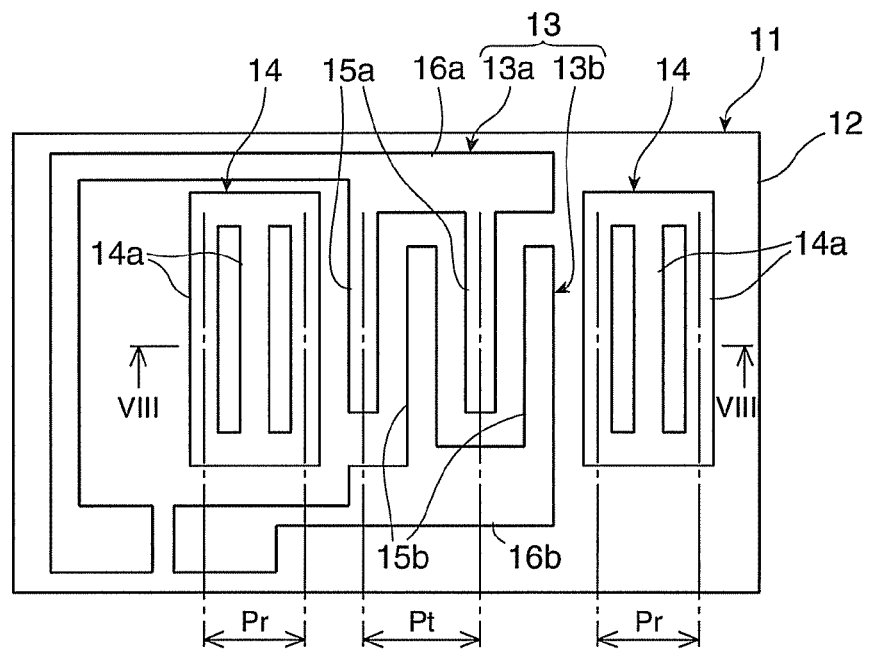
FIG. 8(A) is a plan view showing a first example of a SAW device according to the invention.
Figure 8B:
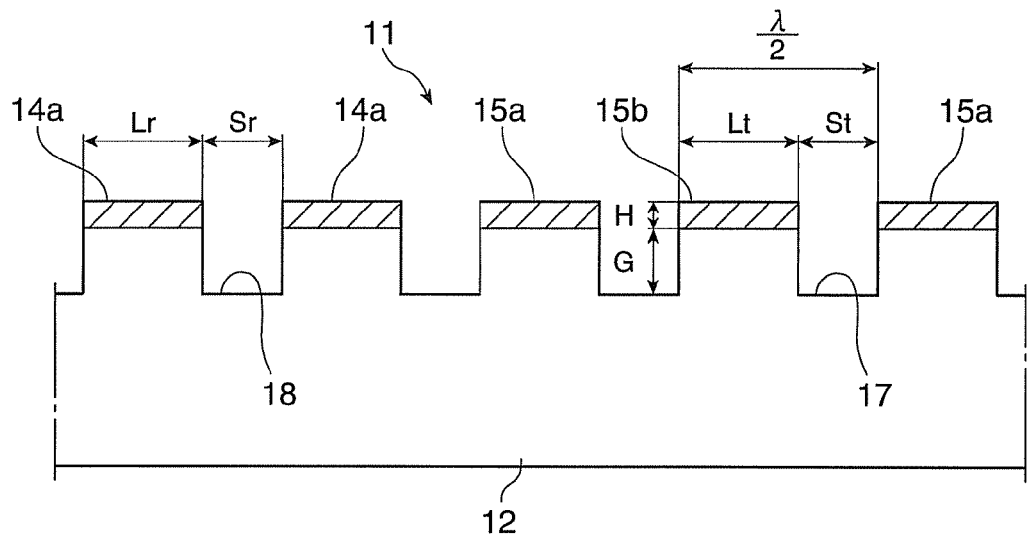
FIG. 8(B) is a partial enlarged longitudinal sectional view taken along the line VIII-VIII.

FIGS. 8(A) and 8(B) show a first example of a SAW resonator according to the invention. A SAW resonator 11 of this example has a rectangular quartz crystal substrate 12, and an IDT 13 and a pair of reflectors 14 and 14 which are formed on the principal surface of the quartz crystal substrate. For the quartz crystal substrate 12, a quartz crystal substrate having the same Euler angles ($-1° \leq \phi \leq 1°$, $117° \leq \theta \leq 142°$, $42.79° \leq |\psi| \leq 49.57°$) as the quartz crystal substrate 2 of the SAW resonator 1 described with reference to FIG. 1 is used.

The IDT 13 has a pair of interdigital transducers 13a and 13b which respectively have a plurality of electrode fingers 15a and 15b, the base portions of the electrode fingers 15a and 15b being connected together by bus bars 16a and 16b. The electrode fingers 15a and 15b are arranged such that the extension direction thereof is perpendicular to the propagation direction of the SAW excited by the IDT. The electrode fingers 15a of the interdigital transducer 13a and the electrode fingers 15b of the interdigital transducer 13b are arranged with a given pitch alternately and at a predetermined interval. Inter-electrode-finger grooves 17 having a given depth are recessed in the surface of the quartz crystal substrate exposed between the electrode fingers 15a and 15b by removing the surface through etching or the like.

A pair of reflectors 14 and 14 are arranged on both sides of the IDT 13 with the IDT sandwiched therebetween along the SAW propagation direction. The reflectors 14 respectively have a plurality of conductor strips (electrode fingers) 14a and 14a arranged with a given pitch in the SAW propagation direction. Similarly to the electrode fingers of the IDT 13, the conductor strips are arranged such that the extension direction thereof is perpendicular to the SAW propagation direction. Inter-conductor-strip grooves 18 having a given depth are recessed in the surface of the quartz crystal substrate 12 exposed between the conductor strips 14a and 14a by removing the surface through etching or the like.

The electrode fingers 15a and 15b and the conductor strips 14a and 14a are formed of metal films using, for example, Al or an alloy mainly containing Al to have the same thickness H. The inter-electrode-finger grooves 17 and the inter-conductor-strip grooves 18 are formed to have the same depth G. Grooves are recessed between the innermost conductor strips of the reflectors 14 and 14 and the outermost electrode fingers 15a (or 15b) of the IDT 13 adjacent to the conductor strips by removing the surface of the quartz crystal substrate to have the same depth as the inter-conductor-strip grooves.

With this configuration, the SAW resonator 11 excites a Rayleigh-type SAW which has vibration displacement components in both the X'-axis direction and the Y'-axis direction of the quartz crystal substrate 12. With the use of the quartz crystal substrate 12 having the above-described Euler angles, the SAW propagation direction is shifted from the X axis serving as the crystal axis of quartz crystal, thereby exciting the SAW in the stopband upper end mode.

As shown in FIG. 8(B), when the line width of the electrode fingers 15a and 15b is Lt, and the width of the inter-electrode-finger grooves 17 is St, the line occupancy η of the IDT 13 is expressed by $\eta = Lt/(Lt+St)$. When the line width of the conductor strips 14a is Lr, and the width of the inter-conductor-strip grooves 18 is Sr, the line occupancy ηr of the reflectors 14 is expressed by $\eta r = Lr/(Lr+Sr)$.

The pitch Pt of the electrode fingers of the IDT 13 and the pitch Pr of the conductor strips of the reflectors 14 will be described. When Lt+St=dt, the relationship between the electrode finger pitch Pt of a pair of intersecting interdigital transducers 13a and 13b, the line width Lt of the electrode fingers, and the width between the electrode fingers (that is, the width St of the inter-electrode-finger grooves in the SAW propagation direction) becomes $Pt=2 \times dt=2 \times (Lt+St)$. That is, when viewed in the SAW propagation direction, an inter-center distance dt (so-called line and space) between adjacent electrode finger 13a and electrode finger 13b becomes dt=Lt+St. Thus, the electrode finger pitch becomes $Pt=2 \times dt=\lambda$.

With regard to the reflectors 14, when viewed in the SAW propagation direction, an inter-center distance dr between adjacent conductor strips 14a becomes dr=Lr+Sr. The inter-center distance dr is half the wavelength λ of the SAW which propagates through the reflectors 14, that is, $dr=\lambda/2$. Thus, the pitch Pr of the conductor strips 14a becomes $Pr=2 \times dr=2 \times (Lr+Sr)$.

The line occupancy η of the IDT 13 and the line occupancy ηr of the reflector 14 are set to satisfy the relationship η<ηr. Thus, the SAW resonator 11 can realize an excellent frequency-temperature characteristic with a very small frequency fluctuation and a high Q value in the operation temperature range simultaneously.

Example 1

The specification of the SAW resonator 11 was as follows.
Quartz crystal substrate size: 5.0×1.5 (mm)
Euler angles: (0°, 123°, ψ)
Number of pairs of IDT: 180
Number of reflectors (per side): 78
  The IDT 13 was designed as follows.
SAW wavelength λ: 7.9 (μm)
Electrode material: Al
Electrode finger thickness H: 0.02λ (2%λ)=0.1580 (μm)
Electrode finger pitch Pt: λ/2=3.95 (μm)
Electrode finger line width Lt: 0.625Pt=2.4688 (μm)
(line occupancy η: 0.625)
  The reflectors 14 were designed as follows.
Electrode material: Al
Conductor strip thickness H: 2%λ (0.02λ)=0.1580 (μm)
Conductor strip pitch Pr: λ/2=3.95 (μm)
Conductor strip line width: 0.725Pr=2.8638 (μm)
(line occupancy ηr: 0.725)
  The inter-electrode-finger grooves 17 were designed as follows.
Depth: 0.045λ (4.5%λ)=0.3555 (μm)
Effective electrode finger thickness: 0.065λ (6.5%λ)=0.5135 (μm)

Figure 9:
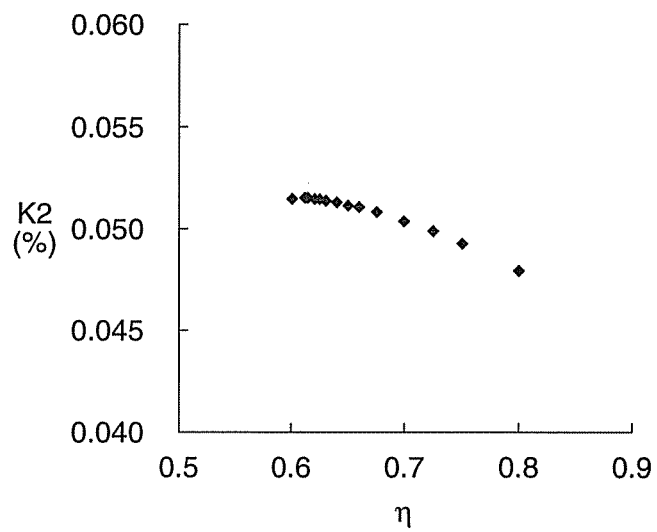
FIG. 9 is a diagram showing the relationship between the IDT line occupancy η and an electro-mechanical coupling coefficient in the first example.

With regard to the SAW resonator 11 designed as above, a change in the electro-mechanical coupling coefficient K2(%) with respect to the line occupancy η of the IDT 13 was simulated. The result is shown in FIG. 9. From FIG. 9, it could be confirmed that, when the line occupancy of the IDT 13 was η=0.60 to 0.66, a high electro-mechanical coupling coefficient was obtained. In particular, when η=0.625, the electro-mechanical coupling coefficient is maximized, thereby attaining low impedance of the SAW resonator, that is, low CI. Thus, when the SAW resonator is used for an oscillator, this contributes to reduction in power consumption.

Figure 10:
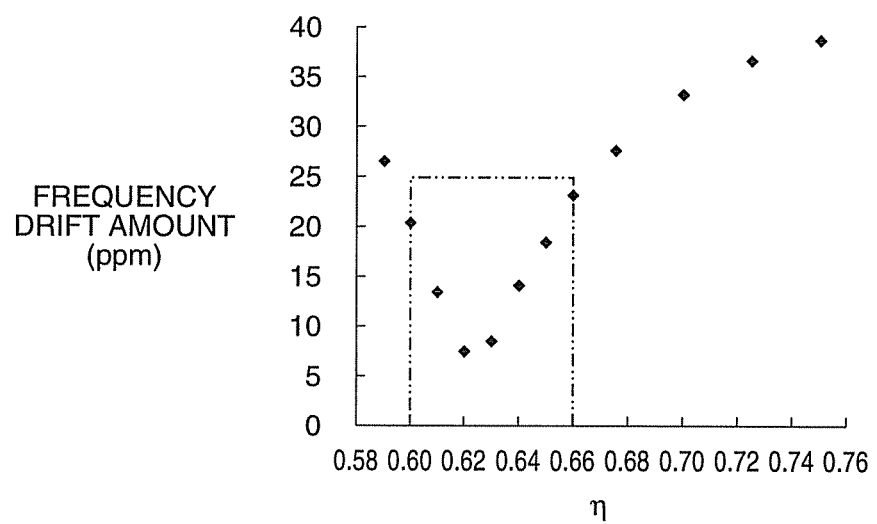
FIG. 10 is a diagram showing the relationship between the IDT line occupancy η and a frequency drift amount in the first example.

A frequency fluctuation (ppm) with respect to the line occupancy η of the IDT 13 was simulated. The result is shown in FIG. 10. From FIG. 10, it could be confirmed that, when the line occupancy of the IDT 13 was η=0.60 to 0.66, an excellent frequency-temperature characteristic with a frequency fluctuation equal to or smaller than 25 ppm was obtained. FIG. 10 shows that, if the line occupancy η of the IDT 13 is outside the range of 0.60 to 0.66, the frequency fluctuation exceeds 25 ppm, and the frequency-temperature characteristic is significantly deteriorated.

Figure 11:
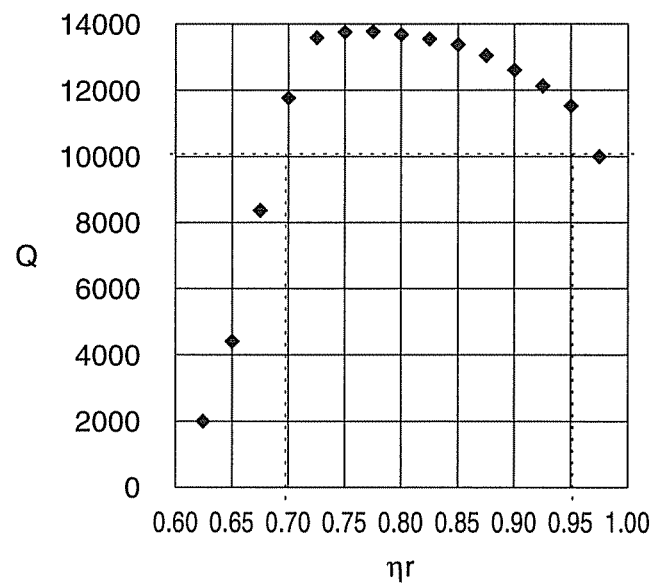
FIG. 11 is a diagram showing the relationship between the reflector line occupancy ηr and the Q value in the first example.

Next, a change in the Q value with respect to the line occupancy ηr of the reflectors 14 was simulated. The result is shown in FIG. 11. From FIG. 11, it could be confirmed that, when the line occupancy ηr of the reflectors 14 was in a range of 0.70≤ηr≤0.95, the Q value was equal to or greater than 10000. Thus, if the SAW resonator 11 is used for an oscillator, a stable oscillation operation can be performed. FIG. 11 shows that, if the line occupancy ηr of the reflectors 14 is smaller than 0.70, the Q value is rapidly lowered to be equal to or smaller than 10000.

Figure 12:
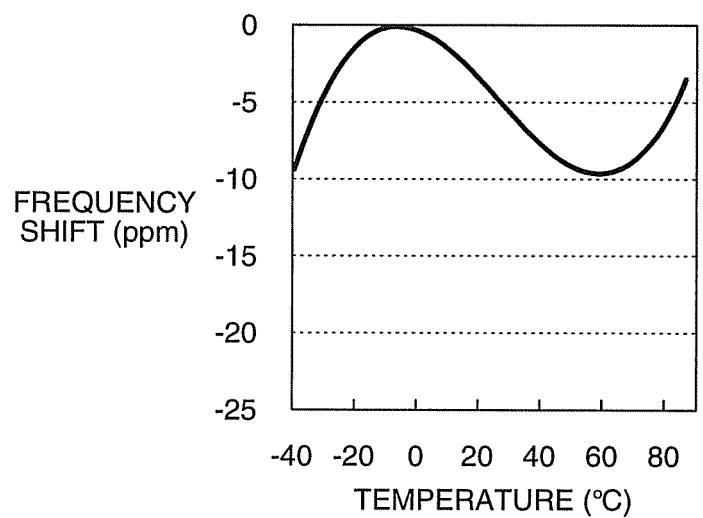
FIG. 12 is a diagram showing the frequency-temperature characteristic of the first example.

With regard to the SAW resonator 11 in which the line occupancy of the IDT 13 is η=0.625 and the line occupancy of the reflectors 14 is μr=0.725, the frequency-temperature characteristic in the operation temperature range was verified by a simulation. The result is shown in FIG. 12. From FIG. 12, in this example, it was confirmed that a frequency fluctuation is very small, about 10 ppm, in the operation temperature range of −40° C. to +85° C., and the SAW resonator has an excellent frequency-temperature characteristic.

Thus, in the SAW resonator 11, when η=0.625 and ηr=0.725, the resonance frequency was 400 MHz, the Q value was 14000, and the CI value was 14Ω. That is, in both cases, a satisfactory result was obtained. Thus, when the SAW resonator was used for an oscillator, it could be confirmed that excellent oscillation stability was obtained.

As a result of putting together the verification results of Example 1, in the SAW resonator 11 according to the example of the invention, it is preferable that the IDT line occupancy is set to be a range of η=0.60 to 0.66 such that the frequency-temperature characteristic and the electro-mechanical coupling coefficient are excellent, and the reflector line occupancy is set to be a range of 0.70≤ηr≤0.95 such that the Q value is excellent. In this way, if electrodes having high reflection efficiency, that is, the conductor strips 14a are arranged in the reflectors 14, the SAW vibration energy can be efficiently confined to the IDT 13 sandwiched between the reflectors. Therefore, it is possible to obtain a SAW resonator which has excellent oscillation stability with a high Q value while realizing an excellent frequency-temperature characteristic and low impedance.

A second example of the SAW resonator 11 according to the invention is configured to obtain a higher Q value in the first example in which the line occupancy η of the IDT 13 and the line occupancy ηr of the reflector 14 are set to be within the above-described ranges. To this end, in this example, the electrode pitch ratio of the IDT 13 and the reflectors 14, that is, a value (Pt/Pr) obtained by dividing the electrode finger pitch Pt of the IDT 13 by the pitch Pr of the conductor strips of the reflectors 14 is set to Pt/Pr≅1.0. Therefore, it is possible to further increase the Q value of the SAW resonator 11 to be more satisfactory.

With regard to the SAW resonator 11 of FIG. 1, a change in the Q value with respect to Pt/Pr was verified by a simulation under the following conditions.
Euler angle: (0°, 123°, 43.80°)
Number of pairs of IDT: 180
Number of reflectors (per side): 78
Electrode finger thickness H: 0.02λ (2%λ)
Inter-electrode-finger groove depth G: 0.045λ (4.5%λ)
IDT line occupancy η: 0.625
Reflector line occupancy ηr: 0.725

Figure 13:
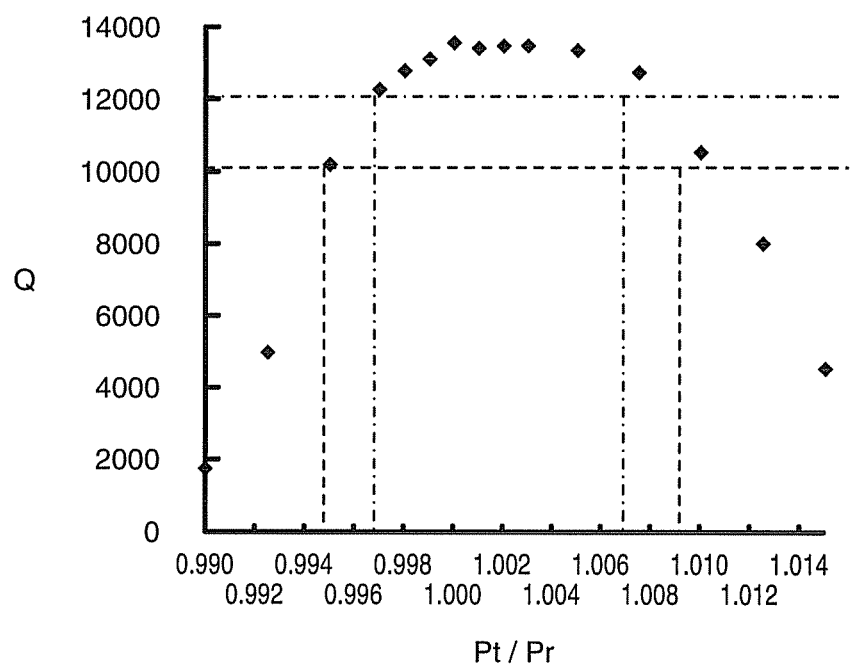
FIG. 13 is a diagram showing a change in the Q value with respect to a pitch ratio Pt/Pr of electrode fingers and conductor strips in a SAW device of a second example.

The simulation result is shown in FIG. 13. As will be understood from FIG. 13, a high Q value of Q>10000 is obtained in a range of Pt/Pr=0.9950 to 1.010, a higher Q value of Q>12000 is obtained in a range of Pt/Pr=0.9975 to 1.0075, and the maximum value of the Q value of Q≅14000 is obtained in a range of Pt/Pr=0.999 to 1.005.

As described above, when the number of pairs of the IDT is 180, and the number of reflectors is 78, while, when η=ηr=0.625, the Q value of only about 4000 is obtained, when η=ηr=0.725, the Q value is improved to be 13500. Meanwhile, when η=0.625 and ηr=0.725, Pt/Pr≅1.00 is set, such that a high Q value of 13500 is obtained. This is considered to be because, when the reflection band of the reflectors determined by the line occupancy ηr substantially coincides with the resonance frequency determined by the IDT line occupancy η=0.625, the line occupancy is ηr≅0.725, and at this time, if Pt/Pr≅1.0, that is, the electrode finger pitch of the IDT and the pitch of the conductor strips of the reflectors are substantially identical, bulk radiation due to the difference between both pitches can be minimized, such that a high Q value is obtained.

The inventors have calculated the IDT line occupancy η, the reflector line occupancy ηr, and the IDT/reflector pitch ratio Pt/Pt for realizing an excellent frequency-temperature characteristic of a cubic curve with a small frequency fluctuation and a high Q value with the electrode finger thickness H, the depth G of inter-electrode-finger grooves, and the Euler angle θ as parameters, and the resultant Q value. The result is shown in Table 2.

TABLE 2

| H | G | θ | η | ηr | Pt/Pr | Q |
|---|---|---|---|----|-------|---|
| 2% λ | 4% λ | 117 | 0.625 | 0.70 | 1.00 | 10700 |
| | | 117 | 0.625 | 0.95 | 1.00 | 10400 |
| | | 123 | 0.625 | 0.70 | 1.00 | 10850 |
| | | 123 | 0.625 | 0.95 | 1.00 | 10600 |
| | | 142 | 0.625 | 0.70 | 1.00 | 10950 |
| | | 142 | 0.625 | 0.95 | 1.00 | 10650 |
| 0.1% λ | 6% λ | 117 | 0.625 | 0.70 | 1.00 | 10150 |
| | | 117 | 0.625 | 0.95 | 1.00 | 10000 |
| | | 123 | 0.625 | 0.70 | 1.00 | 10300 |
| | | 123 | 0.625 | 0.95 | 1.00 | 10050 |
| | | 142 | 0.625 | 0.70 | 1.00 | 10400 |
| | | 142 | 0.625 | 0.95 | 1.00 | 10100 |
| 3.5% λ | 2.5% λ | 117 | 0.625 | 0.70 | 1.00 | 11350 |
| | | 117 | 0.625 | 0.95 | 1.00 | 11000 |
| | | 123 | 0.625 | 0.70 | 1.00 | 11500 |
| | | 123 | 0.625 | 0.95 | 1.00 | 11250 |
| | | 142 | 0.625 | 0.70 | 1.00 | 11600 |
| | | 142 | 0.625 | 0.95 | 1.00 | 11300 |

In general, the Q value is substantially determined by the SAW energy confinement effect. In other words, the Q value is determined by the reflection efficiency of the reflectors, that is, the structure (number of reflectors, effective thickness, electrode line width, density, and the like) of the reflectors. Thus, even when the cut angle of the quartz crystal substrate, for example, the Euler angle θ is somewhat changed, this change has little influence on the Q value. As will be understood from Table 2, while the Euler angle θ is changed to 117°, 123°, and 142° in an angle range such that an excellent frequency-temperature characteristic is obtained, in all cases where η<ηr and Pt/Pr=1.00, it was confirmed that the Q value was equal to or larger than 10000 and has little influence on the Q value.

In general, while the reflection efficiency of the reflectors is strongly influenced by the density of the reflectors, that is, the ratio of the thickness (G) of quartz crystal constituting the reflectors and the electrode thickness (H), Table 2 shows that a difference in specific gravity between quartz crystal and Al is small, and even when the ratio changes, this change has little influence on the reflection efficiency. Thus, in the SAW device according to the example of the invention, it is ascertained that the settings are made to satisfy the relationship $\eta<\eta r$, such that the Q value can be improved dramatically with little influence of the conditions other than $\eta$ and $\eta r$.

Figure 14A:
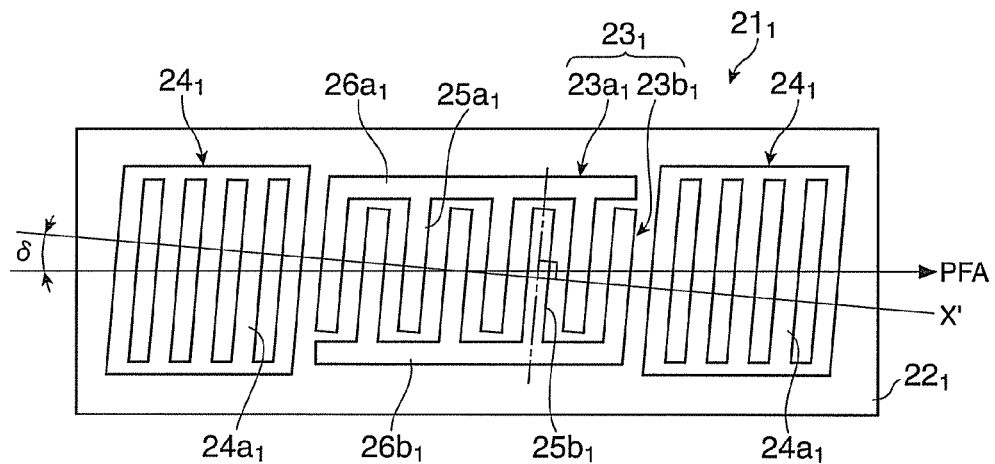
FIGS. 14(A) and 14(B) are plan views showing a SAW device having an inclined IDT according to a third example.

FIGS. 14(A) and (B) show a third example of a SAW resonator having an inclined IDT according to the invention. As in the first example, a SAW resonator $21_1$ of FIG. 14(A) has an inclined IDT $23_1$ and a pair of reflectors $24_1$ and $24_1$ on the principal surface of a quartz crystal substrate $22_1$ expressed by Euler angles ($-1.5°\leq\phi\leq1.5°$, $117°\leq\theta\leq142°$, $42.79°\leq|\psi|\leq49.57°$). The quartz crystal substrate $22_1$ is such that the longitudinal direction thereof is aligned in a direction inclined by a power flow angle (PFA) $\delta°$ in the propagation direction of energy with respect to the X' axis which is the propagation direction of the phase velocity of the SAW excited by the IDT $23_1$.

The IDT $23_1$ has a pair of interdigital transducers $23a_1$ and $23b_1$ which respectively have a plurality of electrode fingers $25a_1$ and $25b_1$, and bus bars $26a_1$ and $26b_1$ connecting the base portions of the electrode fingers. A pair of reflectors $24_1$ and $24_1$ are arranged on both sides of the IDT $23_1$ with the IDT sandwiched therebetween along the SAW propagation direction, and respectively have a plurality of conductor strips $24a_1$ and $24a_1$ arranged in the SAW propagation direction. The electrode fingers $25a_1$ and $25b_1$ and the conductor strips $24a_1$ are arranged such that the extension direction thereof is perpendicular to the X' axis inclined at the power flow angle (PFA) $\delta°$.

As in the first example, inter-electrode-finger grooves are recessed in the surface of the quartz crystal substrate $22_1$ exposed between the electrode fingers $25a_1$ and $25b_1$. Similarly, inter-conductor-strip grooves are recessed in the surface of the quartz crystal substrate $22_2$ between the conductor strips $24a_1$ and $24a_1$.

If at least a part of the IDT and the reflectors are arranged in a direction intersecting the X'-axis direction at the power flow angle $\delta$, the SAW device $21_1$ exhibits the same functional effects as in the first example, thereby further increasing the Q value. Thus, a lower-loss SAW resonator is realized.

Figure 14B:
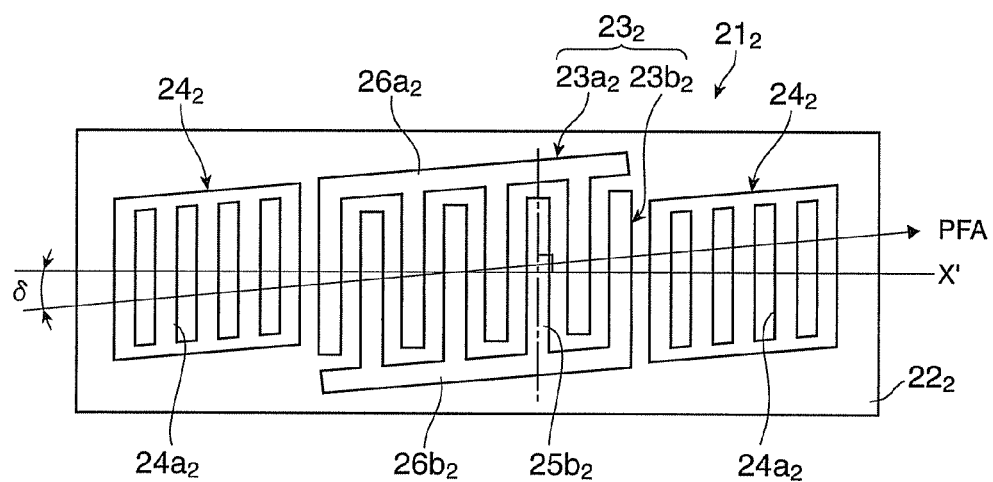

A SAW resonator $21_2$ of FIG. 14(B) has an inclined IDT $23_2$ and a pair of reflectors $24_2$ and $24_2$ having a different configuration from FIG. 14(A) on the principal surface of the quartz crystal substrate $22_2$. The quartz crystal substrate $22_2$ is such that the longitudinal direction thereof is aligned along the X' axis which is the propagation direction of the phase velocity of the SAW excited by the IDT $23_2$.

The IDT $23_2$ has a pair of interdigital transducers $23a_2$ and $23b_2$ which respectively have a plurality of electrode fingers $25a_2$ and $25b_2$, and bus bars $26a_2$ and $26b_2$ connecting the base portions of the electrode fingers. A pair of reflectors $24_2$ and $24_2$ are arranged on both sides of the IDT $23_2$ with the IDT sandwiched therebetween along the SAW propagation direction, and respectively have a plurality of conductor strips $24a_2$ and $24a_2$ arranged in the SAW propagation direction. The electrode fingers $25a_2$ and $25b_2$ and the conductor strip $24a_2$ are arranged such that the extension direction thereof is perpendicular to the X' axis, and the bus bars $26a_2$ and $26b_2$ are aligned in a direction inclined at the power flow angle (PFA) $\delta°$ from the X' axis.

As in the first example, inter-electrode-finger grooves are recessed in the surface of the quartz crystal substrate $22_2$ exposed between the electrode fingers $25a_2$ and $25b_2$. Similarly, inter-conductor-strip grooves are recessed in the surface of the quartz crystal substrate $22_2$ between the conductor strips $24a_2$ and $24a_2$.

In the SAW resonator $21_2$ of this example, if at least a part of the IDT and the reflectors is arranged in a direction intersecting the X'-axis direction at the power flow angle $\delta$ in the above-described manner, a functional effect of realizing a satisfactory frequency-temperature characteristic and a high Q value is exhibited, thereby further increasing the Q value. Thus, a lower-loss SAW resonator is realized.

Figure 15A:
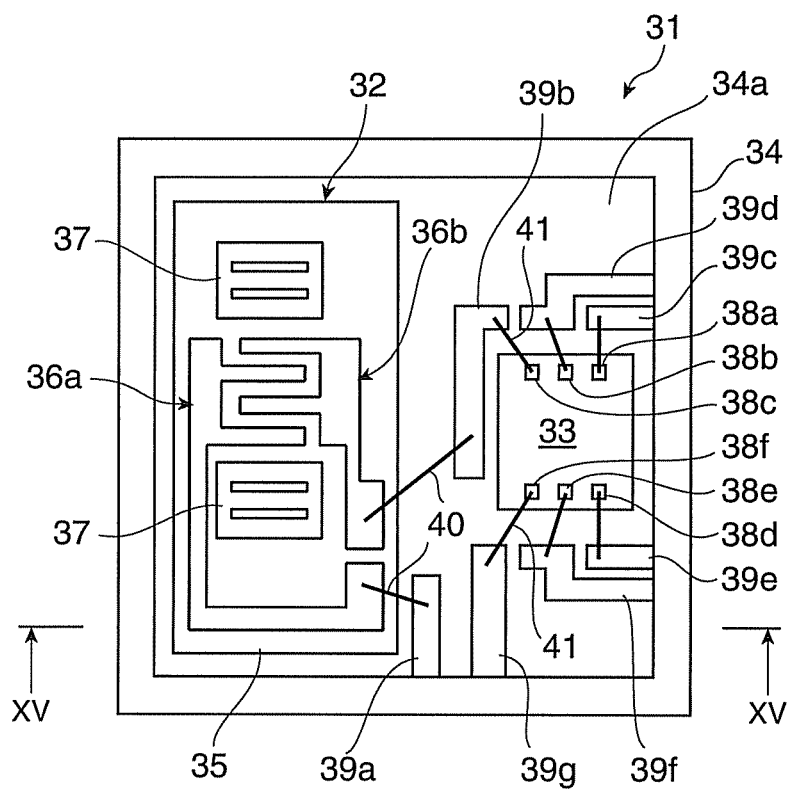
FIG. 15(A) is a plan view showing a SAW oscillator according to an embodiment of the invention.
Figure 15B:
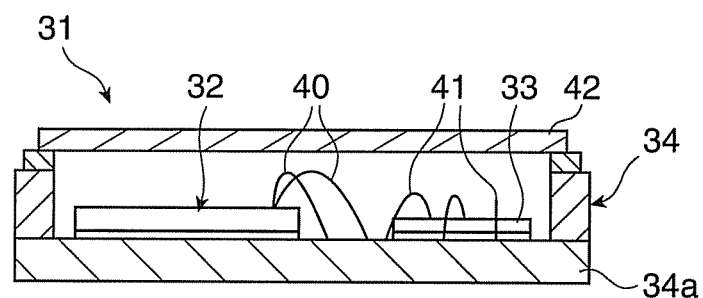
FIG. 15(B) is a longitudinal sectional view taken along the line XV-XV.

The invention may be applied to an oscillator in which the SAW resonator of this embodiment and an oscillation circuit are incorporated. FIGS. 15(A) and 15(B) show the configuration of an example of a SAW oscillator according to the invention. A SAW oscillator 31 of this example includes a SAW resonator 32 of this embodiment, an IC (integrated circuit) 33 which serves as an oscillation circuit to drive and control the SAW resonator, and a package 34 which accommodates the SAW resonator 32 and the IC 33. The SAW resonator 32 and the IC 33 are surface-mounted on a bottom plate 34a of the package 34.

The SAW resonator 32 has the same configuration of the SAW resonator 11 of the first example. The SAW resonator 32 has a quartz crystal substrate 35 which is expressed by the same Euler angles as in the first example, and an IDT having a pair of interdigital transducers 36a and 36b and a pair of reflectors 37 and 37 formed on the surface of the quartz crystal substrate 35. Electrode pads 38a to 38f are provided in the upper surface of the IC 33. Electrode patterns 39a to 39g are formed on the bottom plate 34a of the package 34. The interdigital transducers 36a and 36b of the SAW resonator 32 and the electrode pads 38a to 38f of the IC 33 are electrically connected to the corresponding electrode patterns 39a to 39g by bonding wires 40 and 41. The package 34 in which the SAW resonator 32 and the IC 33 are mounted is sealed airtight by a lid 42 bonded to the upper part of the package 34.

The SAW oscillator 31 of this example includes the SAW resonator of this embodiment, and has an excellent frequency-temperature characteristic with a very small frequency fluctuation in a wide operation temperature range and a high Q value. Therefore, it is possible to perform a stable oscillation operation and to realize reduction in power consumption because of low impedance. As a result, a SAW oscillator is obtained which copes with high-frequency and high-precision performance based on recent high-speed information communication, and includes an environment-resistant characteristic such that, even when temperature varies extremely, a stable operation is ensured for a long period.

The invention is not limited to the foregoing examples, and various modifications or changes may be made within the technical scope. For example, with regard to the electrode structure of the IDT, in addition to the foregoing examples, various known configurations may be used. The invention may also be applied to a SAW device other than the above-described SAW resonator and SAW oscillator. The SAW device of this embodiment may also be widely applied to various electronic apparatuses, such as a mobile phone, a hard disk, a personal computer, a receiver tuner of BS and CS broadcasts, various processing apparatuses for a high-frequency signal or an optical signal which propagates through a coaxial cable or an optical cable, a server network apparatus which requires high-frequency and high-precision clock (low jitter and low phase noise) in a wide temperature range, and a wireless communication apparatus, various module apparatuses, and various sensor apparatuses, such as a pressure sensor, an acceleration sensor, and a rotation speed sensor.

The entire disclosure of Japanese Patent Application No. 2010-201753, filed Sep. 9, 2010 is expressly incorporated by reference herein.

The invention claimed is:

1. A surface acoustic wave device comprising:
a quartz crystal substrate having Euler angles $(-1.5° \leq \phi \leq 0.5°, 117° \leq \theta \leq 142°, 42.79° \leq |\psi| \leq 49.57°)$;
an IDT which has a plurality of electrode fingers on the principal surface of the quartz crystal substrate and excites a surface acoustic wave in a stopband upper end mode; and
a pair of reflectors which respectively have a plurality of conductor strips and are arranged on both sides of the IDT with the IDT sandwiched therebetween along the propagation direction of the surface acoustic wave,
wherein inter-electrode-finger grooves are recessed in the surface of the quartz crystal substrate between adjacent electrode fingers of the IDT,
inter-conductor-strip grooves are recessed in the surface of the quartz crystal substrate between adjacent conductor strips of the reflectors,
the wavelength $\lambda$ of the surface acoustic wave and the depth G of the inter-electrode-finger grooves satisfy the relationship $0.01\lambda \leq G$,
the line occupancy $\eta$ of the IDT and the depth G of the inter-electrode-finger grooves satisfy the following relationships, and $-2.0000 \times G/\lambda + 0.7200 \leq \eta \leq -2.5000 \times G/\lambda + 0.7775$ where $0.0100\lambda \leq G \leq 0.0500\lambda$;

$-3.5898 \times G/\lambda + 0.7995 \leq \eta \leq -2.5000 \times G/\lambda + 0.7775$ where $0.0500\lambda \leq G \leq 0.06952$; and an IDT line occupancy $\eta$ and a reflector line occupancy $\eta r$ satisfy the relationship $\eta < \eta r$.

2. The surface acoustic wave device according to claim 1, wherein the reflector line occupancy $\eta r$ satisfies $0.70 \leq \eta r \leq 0.95$.

3. The surface acoustic wave device according to claim 1, wherein the pitch Pt of the electrode fingers of the IDT and the pitch Pr of the conductor strips of the reflectors satisfy the relationship $0.995 \leq Pt/Pr \leq 1.010$.

4. The surface acoustic wave device according to claim 3, wherein the pitch Pt of the electrode fingers of the IDT and the pitch Pr of the conductor strips of the reflectors satisfy the relationship $0.997 \leq Pt/Pr \leq 1.0075$.

5. The surface acoustic wave device according to claim 1, wherein the IDT line occupancy $\eta$ satisfies the following relationship:

$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda)$.

6. The surface acoustic wave device according to claim 1, wherein the sum of the depth G of the inter-electrode-finger grooves and the thickness H of the electrode fingers satisfies $0.0407\lambda \leq G+H$.

7. The surface acoustic wave device according to claim 1, wherein an angle between a first direction perpendicular to the electrode fingers and the conductor strips and the electrical axis of the quartz crystal substrate is the Euler angle $\psi$,
at least a part of the IDT and the reflectors are arranged in a second direction intersecting the first direction at an angle $\delta$, and
the angle $\delta$ is within a range of a power flow angle $\pm 1°$ of the quartz crystal substrate.

8. The surface acoustic wave device according to claim 1, further comprising:
an oscillation circuit which drives the IDT.

9. An electronic apparatus comprising:
the surface acoustic wave device according to claim 1.

10. A sensor apparatus comprising:
the surface acoustic wave device according to claim 1.

11. The surface acoustic wave device according to claim 2, wherein the pitch Pt of the electrode fingers of the IDT and the pitch Pr of the conductor strips of the reflectors satisfy the relationship $0.995 \leq Pt/Pr \leq 1.010$.

12. The surface acoustic wave device according to claim 2, wherein the IDT line occupancy $\eta$ satisfies the following relationship:

$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda)$.

13. The surface acoustic wave device according to claim 2, wherein the sum of the depth G of the inter-electrode-finger grooves and the thickness H of the electrode fingers satisfies $0.0407\lambda \leq G+H$.

14. The surface acoustic wave device according to claim 2, wherein an angle between a first direction perpendicular to the electrode fingers and the conductor strips and the electrical axis of the quartz crystal substrate is the Euler angle $\psi$,
at least a part of the IDT and the reflectors are arranged in a second direction intersecting the first direction at an angle $\delta$, and
the angle $\delta$ is within a range of a power flow angle $\pm 1°$ of the quartz crystal substrate.

15. The surface acoustic wave device according to claim 2, further comprising:
an oscillation circuit which drives the IDT.

16. An electronic apparatus comprising:
the surface acoustic wave device according to claim 2.

17. A sensor apparatus comprising:
the surface acoustic wave device according to claim 2.

* * * * *